United States Patent
Saito et al.

(10) Patent No.: US 9,503,072 B2
(45) Date of Patent: Nov. 22, 2016

(54) SEMICONDUCTOR SWITCHING DEVICE

(71) Applicant: Mitsubishi Electric Corporation, Tokyo (JP)

(72) Inventors: Shota Saito, Fukuoka (JP); Hitoshi Uemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/888,955

(22) PCT Filed: Aug. 7, 2013

(86) PCT No.: PCT/JP2013/071388
§ 371 (c)(1),
(2) Date: Nov. 4, 2015

(87) PCT Pub. No.: WO2015/019448
PCT Pub. Date: Feb. 12, 2015

(65) Prior Publication Data
US 2016/0072496 A1    Mar. 10, 2016

(51) Int. Cl.
*H03K 3/00*   (2006.01)
*H03K 17/082*  (2006.01)

(52) U.S. Cl.
CPC ................ *H03K 17/0828* (2013.01)

(58) Field of Classification Search
CPC .................................. H03K 17/0828
See application file for complete search history.

(56) References Cited

U.S. PATENT DOCUMENTS

| 5,936,440 A | 8/1999 | Asada et al. | |
| 2009/0219661 A1* | 9/2009 | Mitsuda | H03K 17/0822 361/92 |

FOREIGN PATENT DOCUMENTS

| JP | S62-211563 | 9/1987 |
| JP | H02-037828 A | 2/1990 |
| JP | H10-174310 A | 6/1998 |
| JP | 2004-135378 | 4/2004 |

OTHER PUBLICATIONS

Notification of Transmittal of Translation of the International Preliminary Report on Patentability and Translation of Written Opinion of the International Searching Authority; PCT/JP2013/071388 issued on Feb. 18, 2016.
International Search Report, PCT/JP2013/071388, Sep. 17, 2013.

* cited by examiner

*Primary Examiner* — Daniel Puentes
(74) *Attorney, Agent, or Firm* — Studebaker & Brackett PC

(57) ABSTRACT

A switching element (A) is connected in parallel to a load (L). A switching element (B) is connected between the switching element (A) and a grounding point. The drive circuit (1) drives the switching element (A). The drive circuit (2) drives the switching element (B). Upon detecting a load short circuit, a load short circuit detection circuit (3) outputs a first signal. A timer (6) outputs a second signal after a lapse of a predetermined time after inputting the first signal. Upon receiving the first signal, the drive circuit (1) turns ON the switching element (A). Upon receiving the second signal, the drive circuit (2) turns OFF the switching element (B).

4 Claims, 4 Drawing Sheets

SEMICONDUCTOR SWITCHING DEVICE

TECHNICAL FIELD

The present invention relates to a semiconductor switching device used for power conversion or inverter control in electric railway or power transmission.

BACKGROUND ART

When an arm short circuit occurs in a semiconductor switching device, it is possible to detect the short circuit and safely turn off the power within a defined time period. However, when a load short circuit occurs, a gate-emitter voltage is more likely to rise compared to the arm short circuit, and a saturation current of a main current that flows through the semiconductor switching device continues to increase. Furthermore, compared to the arm short circuit, a gate-emitter control voltage VGE tends to vary between chips and the main current flowing between chips tends to vary, by being induced by di/dt of the main current.

FIG. 4 is a diagram illustrating measured waveforms of a current and a voltage when a load short circuit occurs and the semiconductor switching device is destroyed. VCE represents a collector-emitter voltage and IC1 to IC3 represent collector currents of three switching elements connected in parallel to one another. The IC1 to IC3 become unbalanced and the current is concentrated on a certain switching element, leading to a latch-up destruction or a thermal destruction.

Thus, compared to the arm short circuit, the load short circuit is likely to involve a greater saturation current, producing unbalance among branch currents flowing between chips and leading to a latch-up destruction or turn-off destruction. Thus, a device is proposed which causes, when a load short circuit occurs, an arm short circuit to take place using a third switch provided on the load side to thereby prevent a destruction caused by the load short circuit (e.g., see Patent Literature 1).

CITATION LIST

Patent Literature

Patent Literature 1: Japanese Patent Application Laid-Open No. 62-272821

SUMMARY OF INVENTION

Technical Problem

The prior art requires the third switch, a control circuit for the third switch and wiring for passing a short circuit current. This complicates the control, resulting in a problem that the number of parts increases compared to the existing device.

The present invention has been implemented to solve the above-described problem and it is an object of the present invention to provide a semiconductor switching device capable of facilitating control for preventing a destruction by a load short circuit and reducing the number of parts.

Means for Solving the Problems

A semiconductor switching device according to the present invention includes: a first switching element connected in parallel to a load; a second switching element connected between the first switching element and a grounding point; a first drive circuit driving the first switching element; a second drive circuit driving the second switching element; a load short circuit detection circuit outputting a first signal upon detecting a load short circuit; and a timer outputting a second signal after a lapse of a predetermined time after inputting the first signal, wherein upon receiving the first signal, the first drive circuit turns ON the first switching element, and upon receiving the second signal, the second drive circuit turns OFF the second switching element.

Advantageous Effects of Invention

The present invention makes it possible to facilitate control for preventing a destruction by a load short circuit and reduce the number of parts

DESCRIPTION OF EMBODIMENTS

A semiconductor switching device according to the embodiments of the present invention will be described with reference to the drawings. The same components will be denoted by the same symbols, and the repeated description thereof may be omitted.

Embodiment 1

Figure 1:
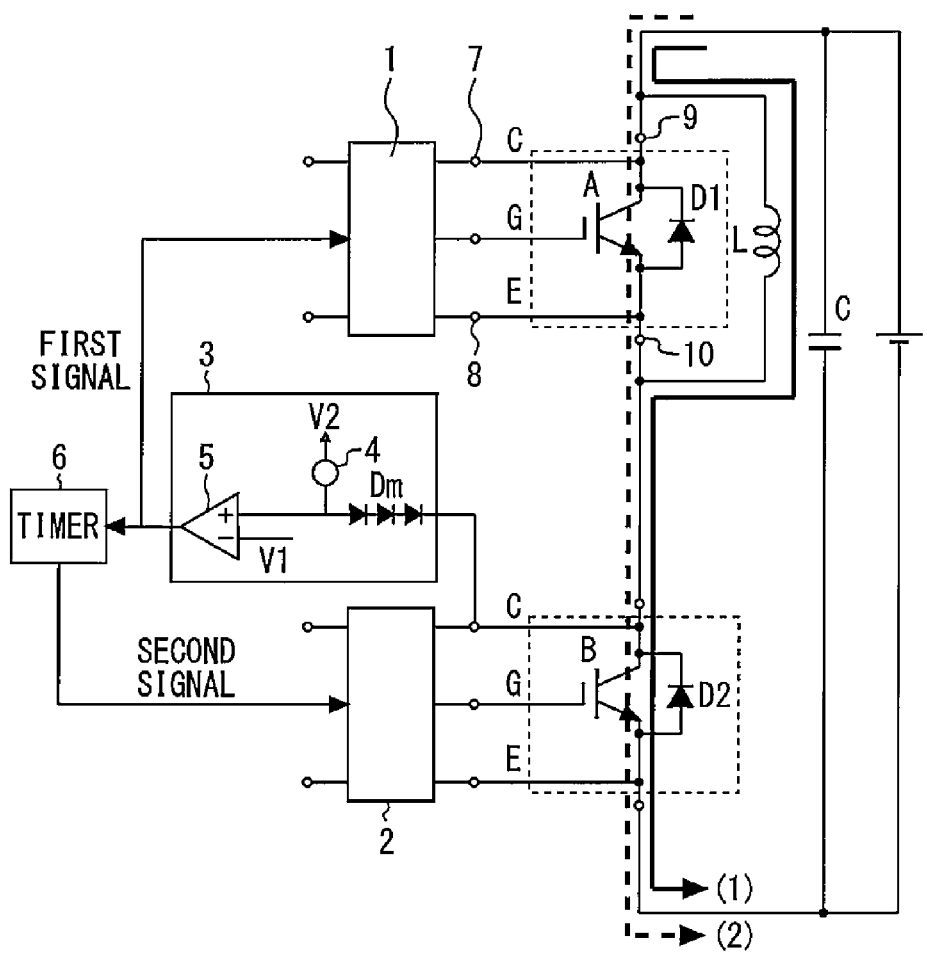
FIG. 1 is a circuit diagram illustrating a semiconductor switching device according to Embodiment 1 of the present invention.

FIG. 1 is a circuit diagram illustrating a semiconductor switching device according to Embodiment 1 of the present invention. A switching element A is connected in parallel to a load L. A switching element B is connected between the switching element A and a grounding point. The switching elements A and B are IGBTs (Insulated Gate Bipolar Transistors), but without being limited to this, these may also be transistors or MOSFETs (Metal-Oxide-Semiconductor Field-Effect Transistors), and the material thereof may be Si or SiC.

A drive circuit 1 drives the switching element A and a drive circuit 2 drives the switching element B. Free-wheel diodes D1 and D2 are connected in parallel to the switching elements A and B respectively. A capacitor C and a power supply are connected in parallel to the switching elements A and B.

When the switching element A is turned OFF and the switching element B is turned ON, the main current flows through path (1) and a load short circuit occurs. When a collector-emitter voltage VCE of the switching element B exceeds a predetermined voltage, a load short circuit detection circuit 3 determines this to be a load short circuit and outputs a first signal.

More specifically, the load short circuit detection circuit 3 includes a constant current source 4 connected to a power supply of a voltage V2, a diode Dm and a comparator 5. When the VCE of the switching element B is smaller than V2, the current from the constant current source 4 passes through the diode Dm and flows into a collector of the switching element B. When the VCE exceeds V2, the comparator 5 detects VCE>V1 and outputs the first signal.

Upon receiving the first signal, the drive circuit 1 turns ON the switching element A. In this case, the main current flows through path (2) and an arm short circuit occurs. A timer 6 outputs a second signal a predetermined time (several μs) after inputting the first signal. Upon receiving the second signal, the drive circuit 2 turns OFF the switching element B and cuts off the short circuit current.

Figure 2:
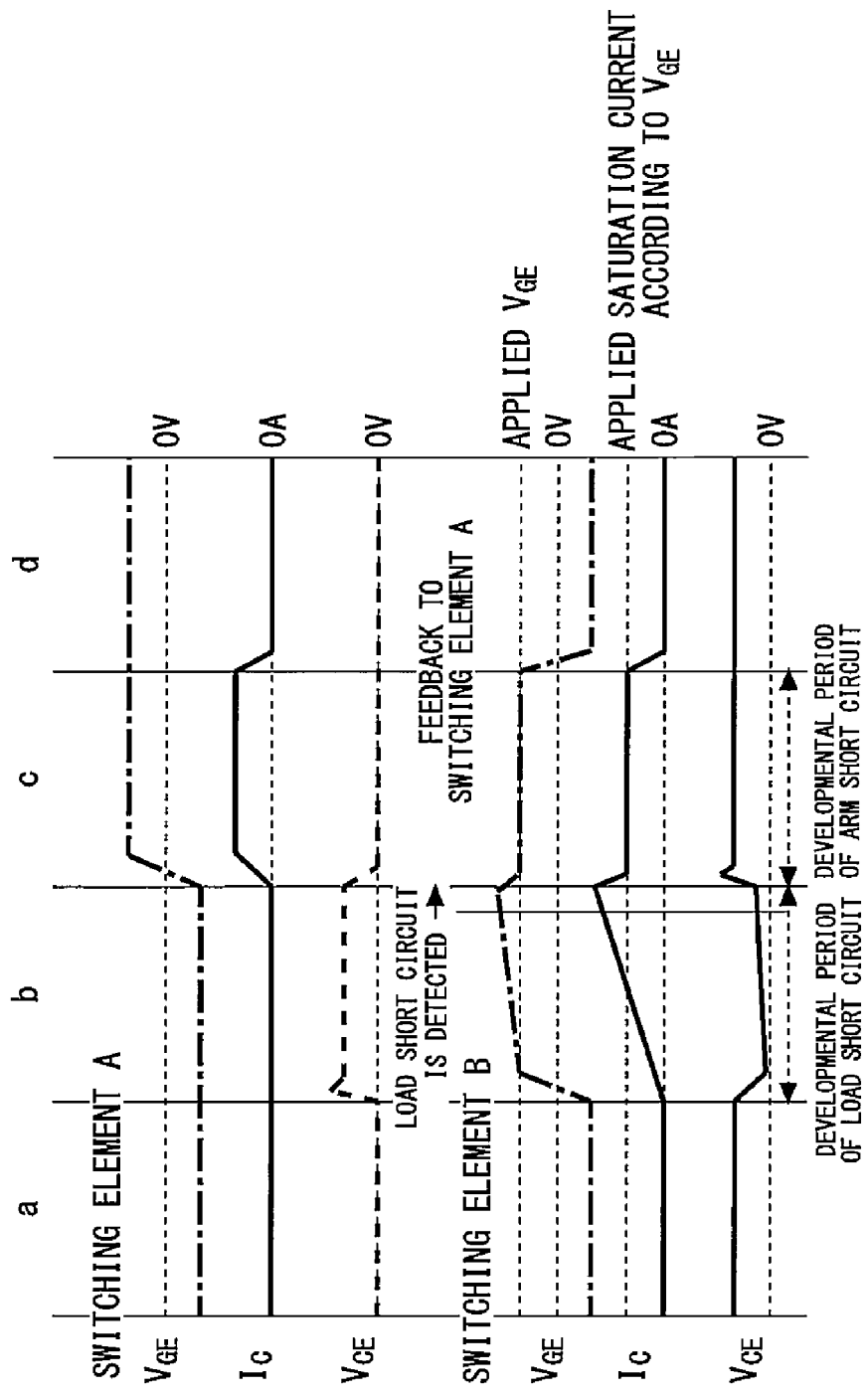
FIG. 2 is a timing chart indicating operation of the semiconductor switching device according to Embodiment 1 of the present invention.

FIG. 2 is a timing chart indicating operation of the semiconductor switching device according to Embodiment 1 of the present invention. Suppose the collector current of the switching elements A and B is Ic, the gate-emitter voltage is VGE, and the collector-emitter voltage is VCE.

First, during a period of a, the switching elements A and B are OFF. Next, during a period of b, the switching element B is ON, the main current flows through path (1) that passes through the short-circuited load L and a load short circuit occurs. The current 1 flowing through the switching element B increases as I=t×V/L according to an inductance L of the load L (t is time and V is a voltage). In this case, when a plurality of switching elements are connected in parallel, by being induced by di/dt, current unbalance occurs. Furthermore, VGE rises under the influence of the load short circuit and the saturation current of the switching elements increases.

Next, the switching element A is turned ON during a period of c, the current flows through path (2) passing through the switching elements A and B and an arm short circuit occurs. The VGE of the switching element A is stable in a state of an applied voltage and a short circuit current saturates according to transmission characteristics. The saturation of the short circuit current cancels the rising of the VGE of the switching element B and also eliminates the current unbalance between chips. The VCE is shifted to the switching element B having a high temperature and high resistance. Lastly, during a period of d, the switching elements A and B are turned OFF again. The device can be safely shut clown by turning OFF the power when the current flowing through the switching element B is suppressed and the current unbalance between chips is canceled.

In the present embodiment, when a load short circuit occurs, the switching element A is turned ON to produce an arm short circuit, and the switching element B is turned OFF after a lapse of a predetermined time. Thus, it is possible to prevent an increase in the gate-emitter control voltage and an increase in the saturation current by switching the load short circuit to the arm short circuit, and thereby safely turn OFF the power. In the present embodiment, it is possible to cancel the load short circuit using an existing circuit. Thus, it is possible to facilitate control to prevent a destruction due to the load short circuit and reduce the number of parts compared to the prior art.

Furthermore, it is possible to detect a load short circuit accurately by measuring a voltage between a collector auxiliary electrode 7 and an emitter auxiliary electrode 8 as the collector-emitter voltage of the switching element B. However, a voltage between a collector electrode 9 and an emitter electrode 10 may also be measured. Note that effects similar to those of Embodiment 1 can be obtained using n switching elements connected in series to a closed circuit instead of the switching element A.

Embodiment 2

Figure 3:
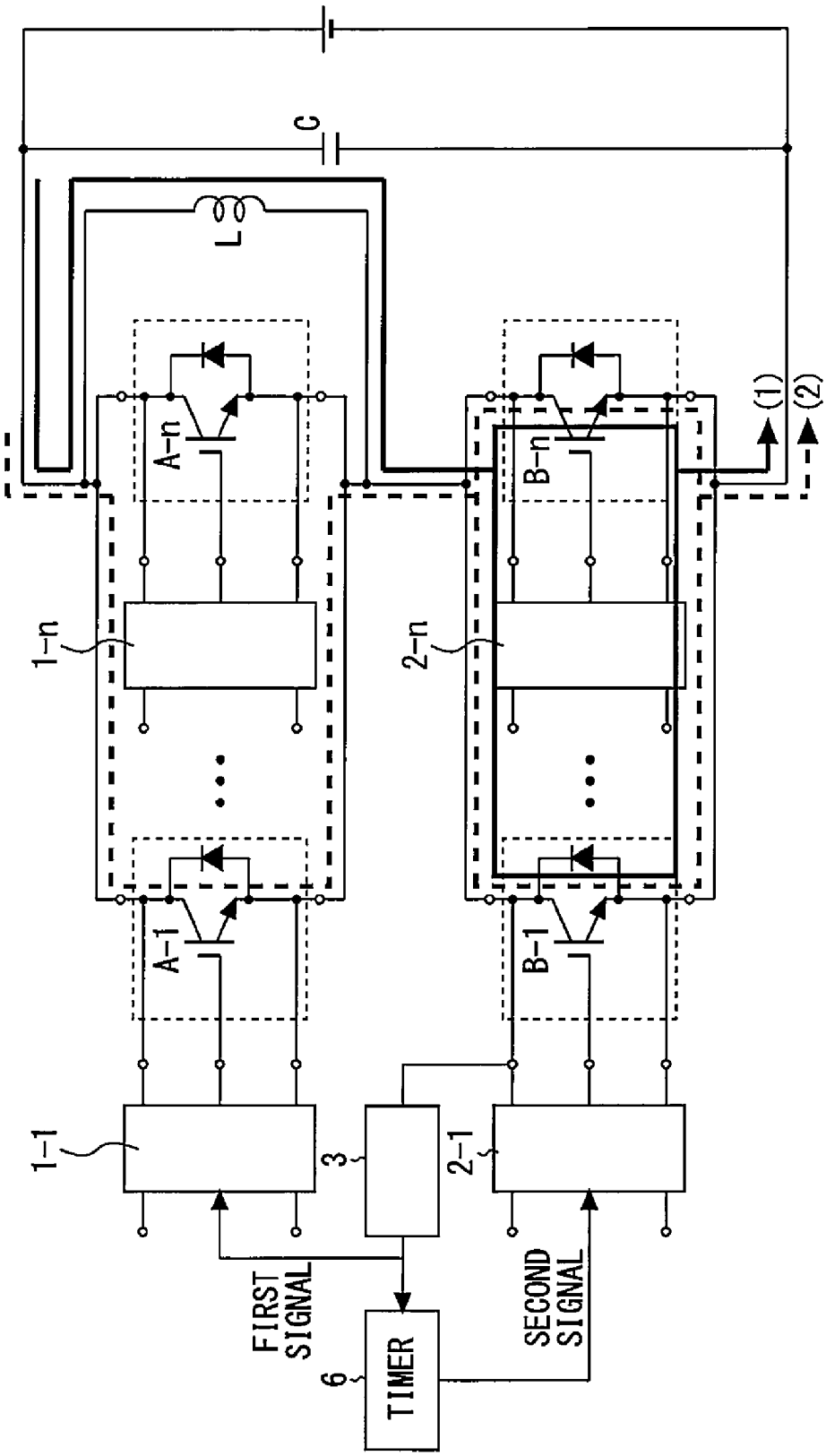
FIG. 3 is a circuit diagram illustrating a semiconductor switching device according to Embodiment 2 of the present invention.
Figure 4:
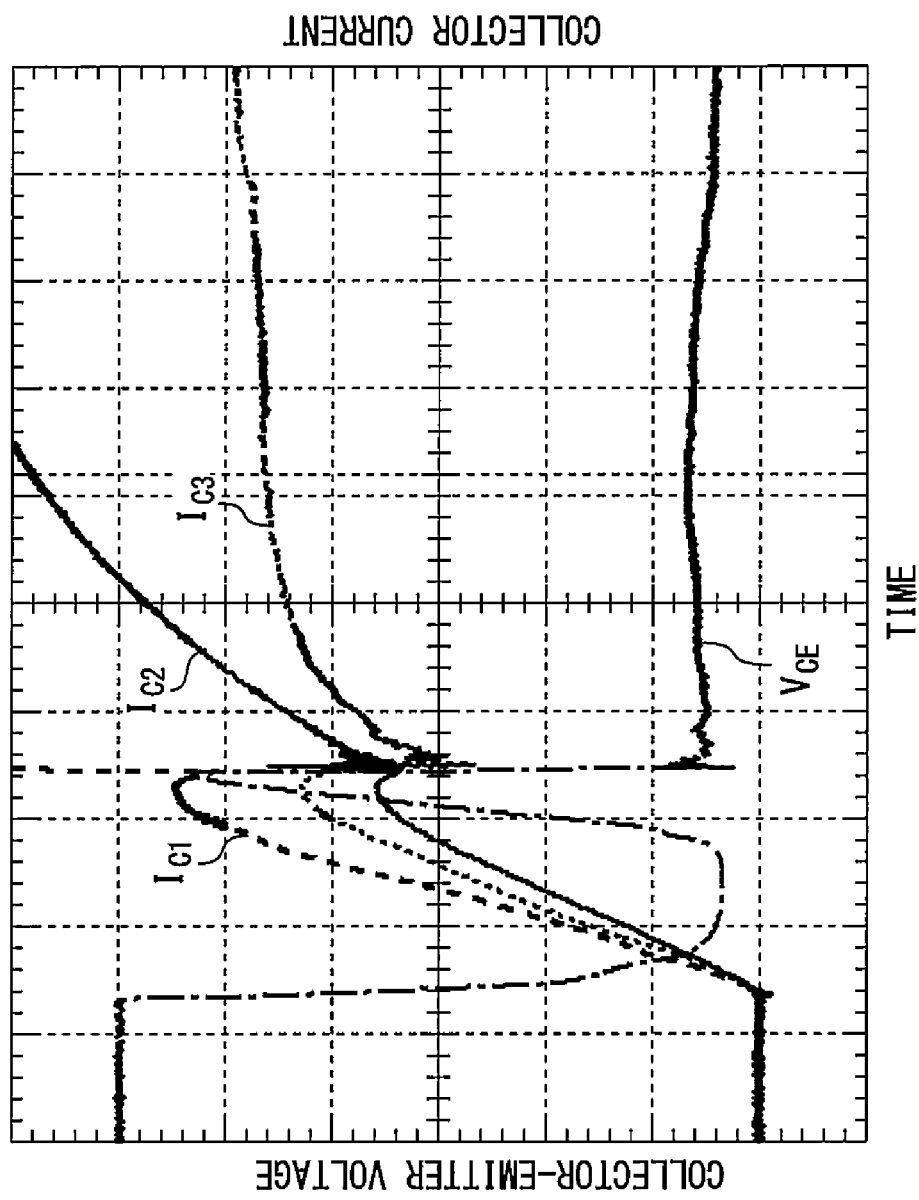
FIG. 4 is a diagram illustrating measured waveforms of a current and a voltage when a load short circuit occurs and the semiconductor switching device is destroyed.

FIG. 3 is a circuit diagram illustrating a semiconductor switching device according to Embodiment 2 of the present invention. The circuit includes n switching elements A-1, . . . , A-n connected in parallel to one another. Drive circuits 1-1, . . . , 1-n drive the switching elements A-1, . . . , A-n respectively. The circuit includes n switching elements B-1, . . . , B-n connected in parallel to one another. Drive circuits 2-1, . . . , 2-n drive switching the elements B-1, . . . , B-n respectively.

Upon receiving a first signal, the drive circuits 1-1, . . . , 1-n (here, drive circuit 1-1) turn ON only the switching element A-1. When switching the load short circuit to the arm short circuit, this makes it possible to reduce the short circuit current flowing through the switching elements B-1, . . . , B-n to 1/n and safely shut down the device.

DESCRIPTION OF SYMBOLS

A, A-1, . . . , A-n switching element (first switching element), B switching element (second switching element), L load, 1 drive circuit (first drive circuit), 2 drive circuit (second drive circuit), 3 load short circuit detection circuit, 6 timer

The invention claimed is:
1. A semiconductor switching device comprising:
  a first switching element connected in parallel to a load;
  a second switching element connected between the first switching element and a grounding point;
  a first drive circuit driving the first switching element;
  a second drive circuit driving the second switching element;
  a load short circuit detection circuit outputting a first signal upon detecting a load short circuit; and
  a timer outputting a second signal after a lapse of a predetermined time after inputting the first signal,
  wherein upon receiving the first signal, the first drive circuit turns ON the first switching element, and
  upon receiving the second signal, the second drive circuit turns OFF the second switching element.
2. The semiconductor switching device of claim 1, wherein when a collector-emitter voltage of the second switching element exceeds a predetermined voltage, the load short circuit detection circuit outputs the first signal.
3. The semiconductor switching device of claim 1, wherein the first switching element includes a plurality of switching elements connected in parallel to one another, and upon receiving the first signal, the first drive circuit turns ON only one of the plurality of switching elements.
4. The semiconductor switching device of claim 1, wherein the first and second switching elements are transistors, MOSFETs or IGBTs which are made of Si or SiC.

* * * * *